United States Patent [19]

Covington et al.

[11] 4,314,371
[45] Feb. 2, 1982

[54] DIGITAL RADIO COMMUNICATIONS SYSTEM WITH HIGH NOISE IMMUNITY

[76] Inventors: Edward L. Covington, Rte. 1, Claremore, Okla. 74017; Herman D. Self, 1225 E. Freeport, Broken Arrow, Okla. 74012

[21] Appl. No.: 67,709

[22] Filed: Aug. 17, 1979

[51] Int. Cl.³ .................... H04B 1/16; H04L 27/00; H04Q 9/12
[52] U.S. Cl. ................................ 375/58; 455/38; 340/825.44; 340/825.65
[58] Field of Search ............... 375/58, 21, 22; 455/31, 455/38, 50, 63, 70; 340/311, 171 PF, 167, 171 R, 359, 360, 168 B

[56] References Cited

U.S. PATENT DOCUMENTS

| | | | |
|---|---|---|---|
| 2,941,161 | 6/1960 | Scantlin | 455/31 |
| 3,510,777 | 5/1970 | Gordon | 455/38 |
| 3,551,815 | 12/1970 | Berman | 455/38 |
| 3,906,348 | 9/1975 | Willmott | 340/168 R |
| 4,019,142 | 4/1977 | Wycoff | 340/171 PF |
| 4,037,201 | 7/1977 | Willmott | 340/311 |
| 4,075,564 | 2/1978 | Masur et al. | 340/311 |
| 4,121,198 | 10/1978 | Tsuboi et al. | 340/171 R |

*Primary Examiner*—Donald J. Yusko
*Attorney, Agent, or Firm*—Head & Johnson

[57] ABSTRACT

A digital data radio transmission system, such as may be used in communicating point-to-point by radio, in which a keyboard is used to insert a multi-decimal-digit number representing the called station. This is fed to a decimal-to-binary converter, forming a train of binary bits which are then coded in a selected manner so as to be substantially noise immune. The output of the coder then goes to the radio transmitter. At the receiving end, a similar means is provided for obtaining and storing in a 24-bit register the selected number of the called station. The output of the radio detector is then decoded to obtain the 24-bit word representing the called station, which is stored in a second register. A comparator compares the numbers stored in the two registers. When they compare positively, an alarm signal is enabled, or the receiver squelch is broken.

9 Claims, 5 Drawing Figures

DIGITAL RADIO COMMUNICATIONS SYSTEM WITH HIGH NOISE IMMUNITY

BACKGROUND OF THE INVENTION

This invention lies in the field of digital communications systems.

More particularly, it concerns a device which can be added to an analog radio communication system such as a citizen's band radio, for example, so that a selected station can be called once the transmitting and called stations have the apparatus of this invention.

Still more particularly, it is concerned with sending out from one transmitting station a coded digital signal representing the called station, and providing in the called station apparatus for decoding this transmission and detecting when the decoded signal matches the number of the called station.

In radio communication systems such as the citizen's band radios, for example, if an operator at a first station wishes to communicate with a second station, there is no commonly used way of calling that second station except to schedule a particular time and date of communication, so that the called station operator can hear the spoken word calling for a response from him.

Other than by prearranged timing, there is no common way for a first station to communicate specifically with a second station such as when there is a matter of urgency, for example. By the use of the method and apparatus of this invention, it is possible for a first station to key-in a selected group of decimal digits or binary bits, representative of the called station, and to cause a coded facsimile of this word to be transmitted over the air. Upon receipt by the called station, this coded train of pulses is decoded and converted to a binary word representative of the called station. This word is compared internally with a binary word which is the number of the called station. When the two numbers agree, an alarm signal is generated.

SUMMARY OF THE INVENTION

It is a primary object of this invention to provide an attachment to a conventional radio transmission system, by means of which a coded train of pulses can be generated, which can be transmitted as a burst of pulses modulating the radio transmitter. At a receiving point which is the called station, means are provided for loading a register with a binary word representative of the station. The signal from the radio detector is continuously decoded and passed through a second register of binary bits, which is the called word. The serial bit words loaded into each of the registers are continuously compared. When the comparison is positive, an alarm signal is generated to alert the called operator that his station is being called.

These and other objects are realized and the limitations of the prior art are overcome in this invention by providing a means for generating a binary word representative of the address of the called station. This is converted, in a coder, to a train of pulses representative of the binary word of the called station and is sent to the radio transmitter. At the receiving station means are provided for producing a multi-bit binary word in a register which is the call number of the station. The output of the radio detector is continuously fed to a decoder, searching for a coded form of a multi-bit binary called number. The decoded number is continuously loaded into a second 24-bit register. A comparator compares the words stored in the local 24-bit register and the second 24-bit register which is being continually updated by receipt of digital signals via the radio. When the comparator indicates that the two 24-bit words are the same, then an alarm signal is enabled.

At the transmission point, means are provided for generating the 24 bits for the multi-bit binary word representative of the number of the called station. This may have as many bits as desired, although it is preferred to be the order of 24 bits which can represent a word having six serial decimal digits. This number of digits would appear to be sufficient for normal calling purposes in a radio communications system which has a limited range. However, the system is not limited to any particular number of binary bits, but it will be described for illustrative purposes only, in terms of six decimal digits or the equivalent 24 binary bits.

The binary bits can be set up in any manner desired, such as by hard wiring a network, or by using manual switches that convert from decimal to binary output, or by means of a keyboard in which the decimal digits can be inserted sequentially and converted to a serial train of binary bits.

The key to the operation of the system lies in the type of coding which is provided. The purpose is primarily to minimize the interference from static noise pulses or from other communication channels.

The coder provides a system in which a digital 1 is represented by a selected number, such as six voltage, or signal, pulses, and the digital 0 is represented by a second selected number, such as twelve voltage or signal pulses. Each pulse comprises a positive pulse lasting a selected time D with a corresponding space of the same time duration D. Between each train of six or twelve pulses, there is an inter-bit space which is a dead space, of no signal, lasting for the length of four pulses, namely, 8D. After 24 bits have been serially coded with the inter-bit spaces between each bit, then an end-of-word code is provided which may be characteristically a train of binary bits, such as a binary zero followed by five binary ones, for example. These digital bits are also coded in the same manner as the bits of the number word.

At the receiving station the coded train of pulses is detected by the radio receiver and is then decoded to convert it back to a digital train of 24 bits, identical to the 24-bit word which was previously coded at the transmitting station. The received 24-bit word is loaded into a 24-bit receiving register. A corresponding word is loaded permanently into a second 24-bit home register, representing the true number of the called station. A continuous comparison is made of the 24 bits in each of the registers. The received bits are continuously being updated as signals come in from the receiver, and if instantaneously, the two trains of 24-bits should be identical, a latch is set which sets up an alarm signal. The alarm signal can be of any conventional signal of selected frequency. The alarm signal can be applied to the loudspeaker of the radio system, and is permitted to run for a selected period of time.

The transmitted binary word is repeated at intervals for as many times as the transmitter desires to send them. Thus, if noise interferes with the reception of one of these repetitions, the decoded signal on a succeeding repetition will provide the 24-bit number which will match with the 24-bit number on the home register.

BRIEF DESCRIPTION OF THE DRAWINGS

These and other objects and advantages of this invention and a better understanding of the principles and details of the invention will be evident from the following description taken in conjunction with the appended drawings in which.

DESCRIPTION OF THE PREFERRED EMBODIMENT

Figure 1:
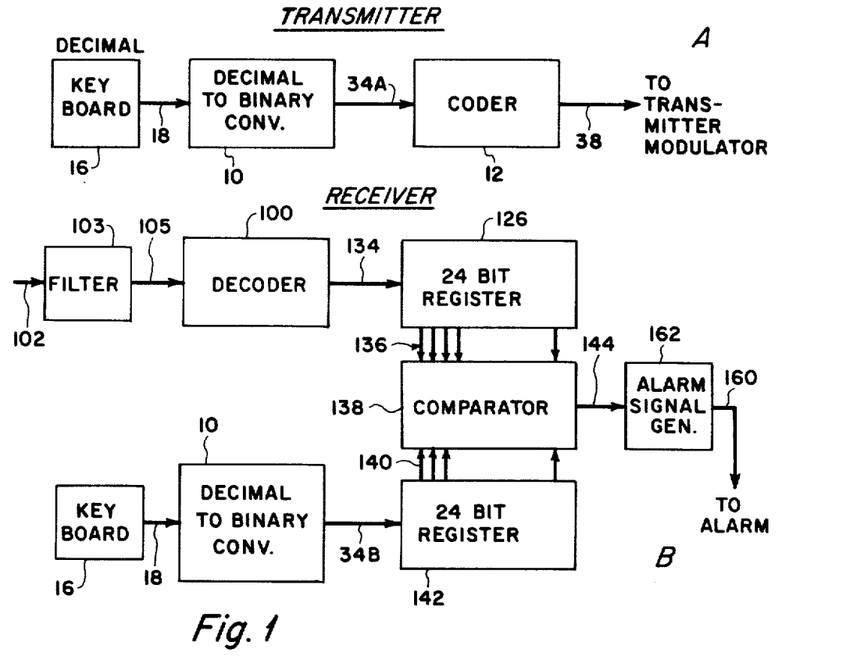
FIG. 1 illustrates in schematic block diagram from one embodiment of this invention.

Referring now to the drawings and particularly to FIG. 1, there is shown a schematic block diagram of the system of this invention.

There are substantially two parts to this invention—one is the transmitting part A, and the other is the receiving part B.

Any characteristic number that can be converted to a train of pulses, preferably of a binary train, can be used as the number which is transmitted over the air to alert a called station. Furthermore, any desired means of introducing into the system the number of the called station can be used. However, for illustrative purposes only, and not by way of limitation, a system will described in which a keyboard is used for introduction, in serial form, of a group of decimal digits, such as six, so that they can be converted to a serial train of binary bits, such as 24, which will then be coded for transmission, and used to modulate the transmitter.

In FIG. 1A the keyboard 16 is a conventional decimal keyboard, which outputs a signal by line 18 to a decimal-to-binary converter 10. For a six decimal digit input, there will be a 24-binary bit train output on line 34A. This binary word is preferably sent out in parallel to a coder 12. The output of the coder will be a longer train of electric pulses, which goes by lead 38 to the radio transmitter.

The portion comprising the keyboard 16 and the decimal-to-binary converter 10 are used for the purpose of generating a number of a called station which is to be transmitted. Also, they are needed to set up in a 24-bit binary home register, the station number at the receiver. This binary number in the home register is to be a reference number, against which the received number, after decoding, is to be compared.

At the receiving station shown in FIG. 1B the keyboard 16 provides a signal on line 18 to a decimal-to-binary converter 10 which outputs a 24-bit parallel number on lead 34B, to a 24-bit binary register 142. So long as the apparatus which is represented by this invention is at the same station and has the same calling number, the 24-bit register 142 carries the same number continuously.

The received and detected radio signal can be picked up at the loud speaker and transmitted by lead 102 to the decoder 100. Since, as will be explained later, this signal will be of a characteristic train of pulses of selected frequency, it can preferably be filtered by means of a filter 103 in order to eliminate a certain amount of interference at that point. The output of the filter then goes through lead 105 to the decoder 100, which will be fully described in FIG. 4. The decoded output of decoder 100 then goes by lead 134 to a 24-bit register 126. Transmission from input 102 to the 24-bit register is continuous. In other words, the received radio signal is being examined continuously for digital data which are passed serially through the decoder to the 24-bit register 126. The 24 bits stored at any one instant in the 24-bit register 126 are carried in parallel by leads 136 to one set of inputs of a comparator 138. The 24 bits stored in the local register, representative of the called or home number, are stored in the 24-bit register 142. These also are sent to the second group of inputs of the comparator, which is continuously matching these two 24-bit words. At any instant that there is an identity between the two 24-bit words, a pulse goes by way of lead 144 to set a latch for an alarm signal generator 126, which puts out a tone or other type of signal on lead 160. The signal on lead 160 can go to a loud speaker at the receiving station.

Figure 2:
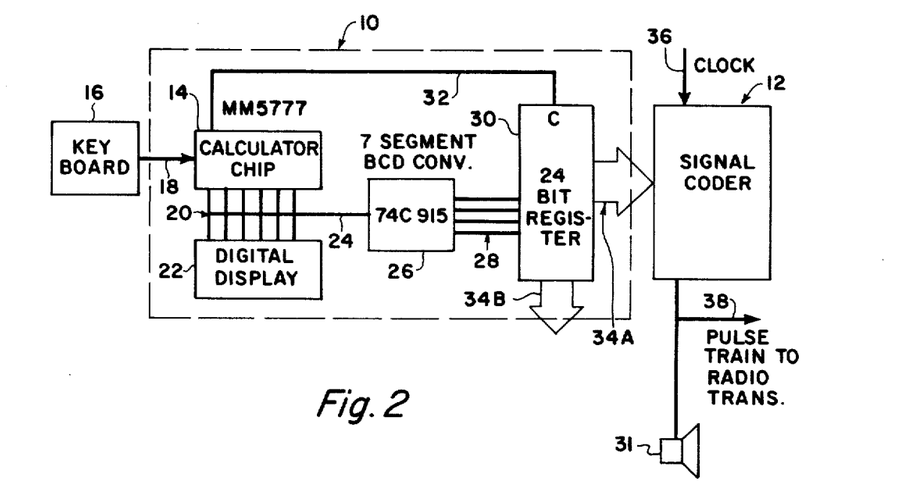
FIG. 2 illustrates the apparatus for providing a multi-bit word which is to be coded and transmitted.

Referring now to FIG. 2, there is shown one embodiment of an apparatus for generating a multi-bit binary word representative of a preselected decimal digit. Again, for example, and solely for convenience, a six-decimal digit number will be used, which is convertible to a 24-bit binary word. A station number may have any number of bits.

The keyboard 16 is provided for sequentially introducing the six decimal digits representing the number to be called. This is transmitted serially through lead 18 to a calculator chip, such as the one manufactured by National Semiconductor Co. and identified by the number MM5777. This chip provides an output, which is applied to a group of seven leads 20 which go to a digital display and one of the seven leads is attached to each of the seven segments of each decimal digit display. Thus, sequentially a display can be provided which will show the six decimal digits which have been called.

These signals on the seven leads 20 then go by lead 24 to a "seven-segment to BCD converter". This is also a chip number 74C915 manufactured by National Semiconductor Co., for example, and identified by numeral 26. The output of the chip 26 is placed on a group of four leads which represent a four-bit binary number corresponding to each of the sequential decimal digits. The signal on the leads 28 go to a 24-bit register, numeral 30.

A lead 32 from the calculator chip 14 goes to a clock input to the register 30 and provides means for sequentially loading the four bit words on leads 28 to adjacent cells in the 24-bit register. By the time the six decimal digits have been entered on the keyboard, there will be 24 bits loaded into the register. The means enclosed within the dashed line 10 are provided in the apparatus which is supplied at each radio station. There are two outputs from the 24-bit register, one of them goes on 24 parallel leads 34A to a signal coder 12. The other goes in 24 parallel leads 34B to the receiving apparatus illustrated in FIG. 4. The coder 12 has a clock input 36, and it has an output lead 38 on which is placed a serial train of voltage pulses which are the result of the coding of the 24 bits. These voltage pulses are sent to the radio for modulation and transmission.

A very simple way of coupling between the output lead 38 and the radio transmitter is to connect the lead 38, by lead 38A, to a loud speaker 31, and to acoustically couple the output of the loud speaker to the microphone of the radio transmitter.

Figure 3:
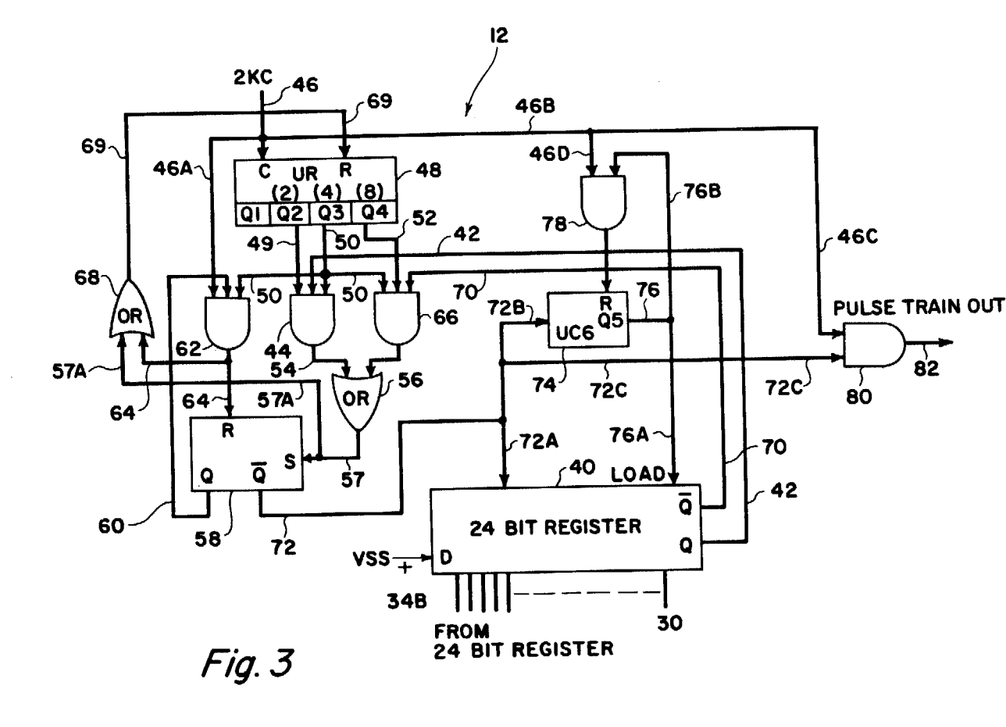
FIG. 3 is one embodiment of a signal coder based upon the coding system of this invention.

Referring now to FIG. 3, there is illustrated one embodiment of a circuit which can be used for coding the 24 binary bits of the number which is the called station. This arrives from FIG. 1 by means of the conductors 34B in the form of 24 separate inputs to a 24-bit register 40. A clock of 2 kilocycles frequency is connected to lead 46 which is used to sequentially time all operations.

Assume at the start that the first bit in the register 40 is being examined and that it is a logical 1. That means that a high signal will be on the Q output, which goes by lead 42 to one of the three inputs to a three-input AND gate 44. Two other inputs are applied to the gate 44 by leads 49 and 50 which go respectively to the Q2 and Q3 outputs of an "UP" counter, numeral 48. This counter is driven by the two kilocycle clock signal on lead 46, to the C or clock input. Lead 69 is the reset input to the counter 48, and this comes from an OR gate 68. Assume that the counter has just been reset and so it starts counting.

When the count is 2, a high signal appears on the Q2 output; and when the count reaches 6, there will be a high output on the Q2 and Q3 outputs, which will enable the gate 44 to open and apply a high signal on lead 54 to an OR gate 56. On receipt of the high signal on 54, the gate 56 outputs a high signal on lead 57 which sets a flip-flop 58 which puts a high signal on the Q output, which goes by lead 60 to AND gate 62, enabling that gate.

Incidentally, the two kilocycle pulses on lead 46 also go by way of lead 46B to a gate 80 at the output of the system. There is a second lead 72C to the gate 80 which when it is enabled permits the sequential pulses on lead 46C to proceed through the gate and out on lead 82 which provide the pulse train which is the coded signal.

So far we have pointed out that if a logical 1 is applied to the 24-bit register 40, the high signal on lead 42 enables the gate 44 and the counter 48 starts counting; and when it reaches a number 6, the gate 44 opens and sets the flip-flop 58. Also, the output of the gate 56 goes by way of lead 57A to the OR gate 68 and goes by lead 69 to the reset terminal of the counter 48 so the counter starts back at zero. When the counter is reset, gate 44 opens and the count continues in the counter 48; and when it reaches the count of 4, a high signal is applied to lead 50, and a previous high on lead 60 is provided, and the clock pulse on 46A causes gate 62 to open and place a high signal on lead 64 through the OR gate 68 and lead 69 to the reset R of counter 48. The counter then starts counting again at zero.

When the gate 62 opens, it resets the flip-flop 58 and the $\overline{Q}$ output goes high by lead 72 and lead 72A to the clock input of the register 40 which shifts the output now of the second bit in the 24-bit register. Assume now that this is a logical zero, which means that the $\overline{Q}$ output will be high and the Q output will be low, so there will be a high signal on lead 70 which goes to enable the gate 66. This is also supplied with two leads 50 from the Q3 output and 52 from the Q4 output of the counter 48.

When the count in the counter 48 is 12, the Q3 and Q4 outputs will both be high, causing the gate 66 to pass a high signal to the OR gate 56 and resetting the flip-flop through lead 57 as before. This high signal on 57 also goes by 57A to the OR gate 68 and lead 69 and resets the counter 48. Again, if it will be followed through, the next step will be, at a count of 4, to open the gate 62 and to reset the flip-flop and through the leads 72, 72A to shift the register again to the next bit, and so on.

As the 24 bits in the register 42 are sequentially shifted and read on the Q and $\overline{Q}$ outputs, the spaces left at the input are filled with logical ones by means of a positive voltage applied to the D input so that by the time the 24 bits have been transmitted, then logical ones begin appearing on the output switch are also coded until a count of 32 is made in the counter 74. At that time a high signal on 76 is provided through lead 76A to the load input of the register 40 which says re-load the register from the 24 inputs 34 which are standing in the 24-bit register 30 of FIG. 2. Thus, there is a repetition of the transmission of the called number, and this can be repeated as many times as desired. Also, when the Q5 output on lead 76 is high it enables gate 78 which on the next clock pulse resets the counter 74 and prepares for a whole new transmission.

When the counter 48 is receiving pulses, but there have not been sufficient pulses to enable gates 44 or 66, the flip-flop 58 will have been reset. Therefore, the $\overline{Q}$ output is high on lead 72, which by lead 72C enables the gate 80. Also, the input clock signal on lead 46 goes by lead 46B and 46B, so that pulses are transmitted through the gate 80 to lead 82 in exact number of the counter 48. Assuming that the digital bit read at the register 40 is a logical 1, when the counter gets to 6, the flip-flop 58 is set which disables the gate 80, and there is a space now for a time equal to four pulse spaces during which the counter goes up to 4, and then enables the gate 62 which resets the flip-flop, enabling the gate 80 to close and pass clock pulses on lead 46C and until a group of 6 or 12 pulses are passed, in accordance with the value of the bit being read. These are transmitted until again the gate 44 or 66 is closed, and the flip-flop is again set, disabling for another series of pulse periods, and so on.

Figure 5:
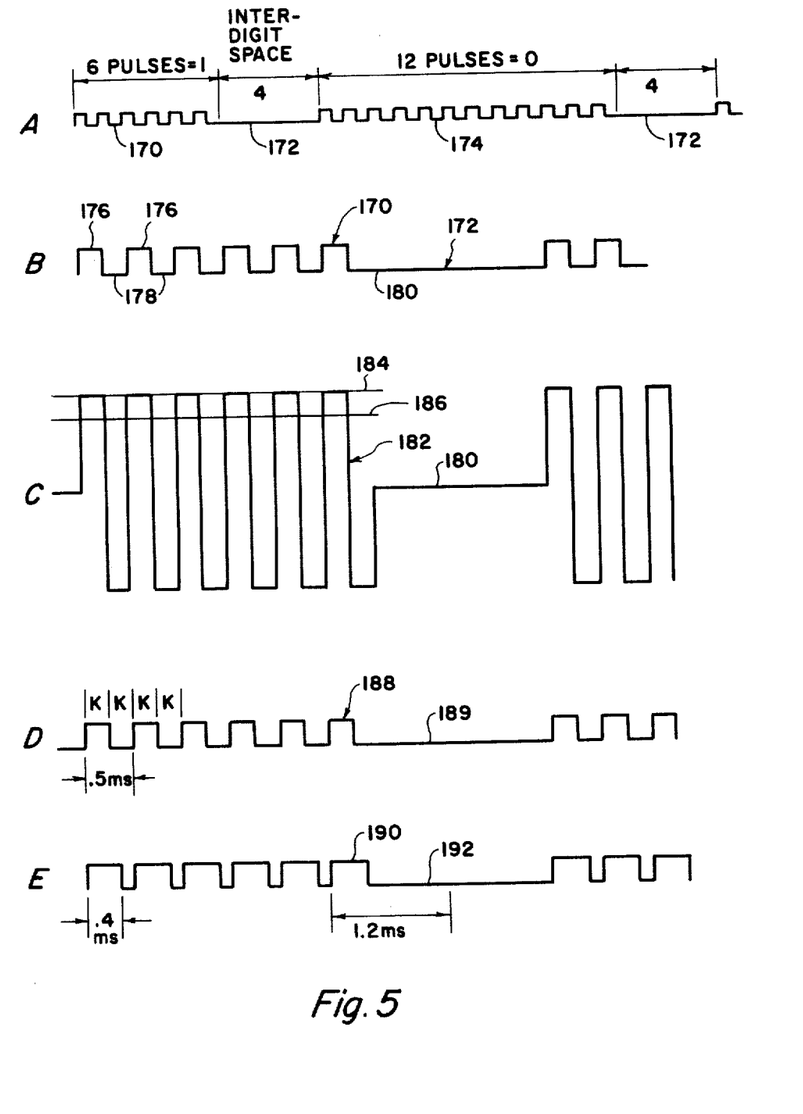
FIG. 5 illustrates the wave forms in various parts of the radio and digital system.

Reference is now made to FIG. 5 where several wave forms are shown on lines A, B, C, D, E. Wave form A represents a coded signal as transmitted over the lead 82 of FIG. 3 to the radio transmitter. On the assumption that the first two digital bits are a logical one and a logical zero, the code requires 6 pulses 170 to be transmitted. Then a quiet period of no signal 172 for a space of 4 pulses. As seen in line D, a signal pulse is represented by a square pulse of time duration K with an equal dead space of time duration K. Then there is a dead space 172 equal to four spaces which is the same as 8K in time duration. If the transmitted signal is of 2000 cycles per second, each of the pulses will be 0.5 milliseconds (ms), and the high value of the signal will be for one-half of that, namely, 0.25 ms.

Back to line A, a series of 12 pulses would represent a logical zero, after which would be the four dead spaces 172, which would indicate an inter-digit space.

On line B the transmitted coded signal 170 is represented by a high value for a time K, numeral 176, a low value 178 of time duration K, a high value 176, and so on until a sequence of 6 highs and 6 lows have been passed. Then the quiet space 172 is provided, and then the next code for the next bit is provided.

In the received signal the analog signal received from the detector is carried to the loud speaker and is taken off at that point, and amplified, and clipped to form more or less of a square wave 182 on line C. Means are provided to determine the peak value 184 for the signal, and a reference cut-off 186 is provided at a selected value less than the potential 184. The signal between the lines 186 and 184 which is again shown in line D, is now the received replica of the coded transmitted signal. By this process, noise of amplitude less than 186 is eliminated from the signal.

Figure 4:
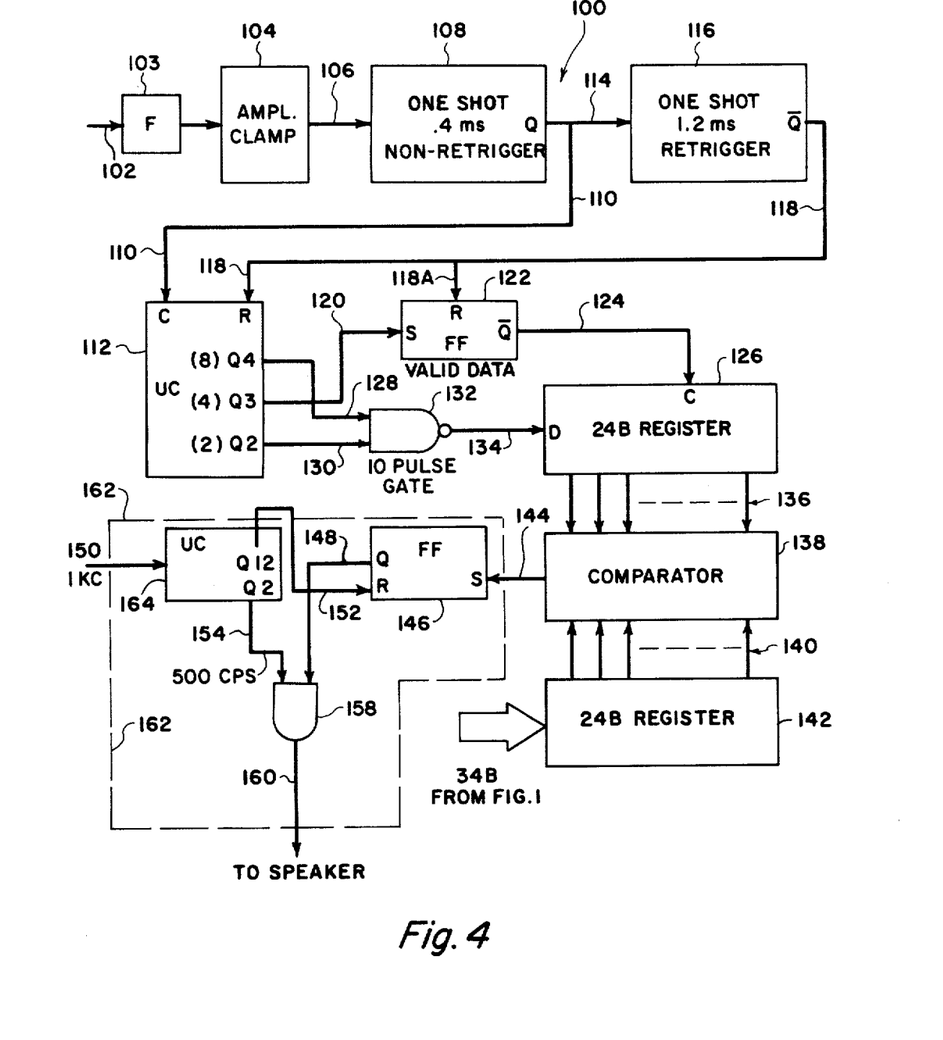
FIG. 4 represents in block diagram for one embodiment of a decoder system and a latch system for generating the alarm signal when a proper comparison is made.

Referring now to FIG. 4, the input line 102 carries the signal D of FIG. 5. A filter 103 is shown which may or may not be used. Since the signal D is of a constant frequency, it may help to eliminate noise signals which are of a different frequency than two kilocycles, for example, which is shown in FIG. 5.

The filtered or non-filtered signal, goes by lead 106 to a one-shot flip-flop. This is a type of flip-flop that once it is set, after a selected time delay, it resets itself. Such a one-shot can be non-retriggerable, in which case once it is set nothing can be done to increase the length of time before it resets itself. On the other hand, a one-shot flip-flop can be provided which is triggerable. In other words, if, before it returns to its reset state, it is retriggered or reset, it will then go on for a new period equal to the normal timing for which it is set, and then it will reset itself. Thus, a continuing series of pulses can keep it set as long as the pulses are recurring. If they do not recur, then in due course, it will reset itself.

An example of the non-retriggerable one-shot is the box 108 which has an operational time of approximately 0.4 ms, which is slightly less than the period of the transmitted signal, as shown in line E. Each pulse 188 thus triggers the one shot 108 and causes it to stay high on the Q output, lead 114, for a time, say 0.4 ms or a little less than the period of 0.5 ms of the pulses. Each time it is set, a high output goes on lead 110 to "UP" counter 112 and makes a count, there are Q2, Q3 and Q4 outlets on this counter, which respectively go high on a count of 2, 4, and 8 respectively.

The output of the one-shot 108 goes also to the set input of a one-shot 116, which is retriggerable. This has a nominal time of resetting of 1.2 ms which is a little longer than the period of 2 pulses of the signal train. Thus if a pulse occurs and then a second pulse occurs, the one shot 116 resets itself, and it will stay reset for another 1.2 ms. Thus, if a train of six pulses occurs as shown in line D, the one shot 116 will stay set until approximately 1.2 ms after the start of the last pulse. If one of the serial pulses in the group of six in line D is missing, because of noise, etc., the succeeding pulse will still retrigger the one shot 116, and this type of noise will not disrupt the normal operation of the circuit.

It is seen, therefore, that the one shot 108 is provided to recognize the individual pulses, and output on the Q outputs proper signals correspondingly. The purpose of the one shot 116 is to stay set until the last pulse of a train or series comes in, and then to reset. By resetting, there are no pulses for a short period thereafter because of the inter-bit space. When the one shot 116 resets it provides a pulse through lead 118, to reset the counter 112, so that it is ready for the next series of pulses.

Again, one shot 116 counts the trains of bits, that is, the groups of 6 or 12, while one shot 108 counts the individual pulses in the group, to differentiate between trains of 6 or 12.

The manner of coding is to select a group of pulses such as 6 for a logical 1 and a group of pulses such as 12 for a logical zero. Then, on the detection side a means is provided by which at least 4 pulses must be counted to make a valid signal. Thus, if there was a logical 1 with six pulses, but two were cancelled in some way because of opposite potential noise pulses, the fact that four were received would indicate that it was a valid signal and count it as a logical 1. If there are noise pulses which add to the six normal pulses so that a count of up to 9 is received, that still counts as a logical 1. Thus, noise pulses could remove 2 from the 6 or add 3 to the 6, and still a logical 1 would be detected. Similarly, for the 12 pulses representative of a logical zero, the circuit of FIG. 4 will accept 10 pulses or as many as 15 pulses for a logical zero.

In FIG. 4 when the count of the counter 112 reaches 4, the Q3 terminal goes high and by lead 120 sets flip-flop 122. This indicates a valid signal. At this time the signal is a logical 1 at the D input of register 126. When the one shot 116 times out, the potential on lead 118 causes counter 122 to reset, and so there is a positive signal on lead 124 which clocks a logical 1 into the register 126. On the other hand, if the count goes up to as many as 10 pulses, that is, if the Q4 and Q2 outputs are high, that indicates a count of 10, the leads 130 and 128 to the gate 132 enable the gate and pass a low signal by line 134 to the shift terminal of the register, calling for a zero as the bit to be entered.

Thus, with a continuing input on lead 102 from the radio receiver, any series of pulses of the approximate frequency to be expected will pass through the filter 103 and will be counted by means of the one shot 108 and the counter 112, and each short train or group of pulses, or each inter-bit space, will be counted by the one shot 116, which causes the register to shift one bit along. Thus, the binary word, stored in the register 126, is continually changing as new pulses are being recognized.

At the same time, the register 142 has been loaded at the receiving station with a 24 bit number representative of the called station and the comparator is continually watching these two sets of 24 bits and comparing, bit-by-bit, to see if they are identical. If not, there is no output from the comparator. When the two numbers are identical, there is an output on lead 144, which goes to the ringing circuit enclosed in the dashed line 162.

Any type of ringing arrangement can be used, of course. A preferred type is to provide a flip-flop 146, which is set by the signal from the comparator. When this flip-flop is set, it puts out a high value on the Q output and lead 148 which goes to the gate 158. At the same time, on lead 150 a 1 kilocycle clock is provided, the Q2 output therefore has a 500 cycle signal which goes by lead 154 to the gate 158. So long as the flip-flop 146 is set, signal on line 148 enables the gate and so a 500 cycle signal goes by lead 160 to the speaker of FIG. 2. This is the calling or ringing signal or alarm. After a count of Q12 or some selected number, the flip-flop 146 is reset over lead 152, and the output on lead 160 is disabled, and the ringing stops.

What has been described is a system of digital signalling on an analog radio channel, by means of which a selected digital number can be transmitted in coded fashion. The coded number is then received and is decoded in a simple way, to provide the original binary word. This is continuously compared to a locally generated word representing the number of the called station. When the incoming word is identical to the local word, a comparator enables a ringing signal to call the operator.

There are, of course, many different circuits that can perform the coding and decoding operations, so these are by way of illustration.

The manner of coding is very important since it is designed to minimize noise interference with the transmission, to ensure that the transmitted number will be clearly received and decoded to provide the proper calling number.

While the apparatus has been described in terms of a six decimal digit input, converted to binary form in the form of a 24-bit word, any selected number of bits can be used for the calling number. Also, while a selected frequency of transmitted pulses and selected numbers of code pulses have been chosen, this is variable and can be higher or lower, as desired, in order to provide transmission as a desired rate.

This apparatus lends itself well to fabrication in the form of a separate box, to an existing radio transmission system such as a citizen's band radio, for example. The box is provided with self-contained batteries, and has only a single cable, which is plugged into the loudspeaker output of the CB set. Thus, the received signal comes from the loudspeaker terminals, while the transmitted signal can be coupled acoustically from the loudspeaker used for the ringing signal through microphone of the transmitter. Very rapid and simple interconnection is possible to add the facility of a digital transmission to an analog radio system.

While the digital transmission can be used for many purposes, one of the very useful purposes is to provide a means for rapid calling and connection to any selected one of a group of radio sets.

While we have defined a signal pulse as a positive pulse followed by a space, the relative time duration of the pulse and the space can be equal or unequal, as long as the total duration of pulse and the space is constant.

While the invention has been described with a certain degree of particularity, it is manifest that many changes be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the rull range of equivalency to which each element thereof is entitled.

What is claimed is:

1. A radio transmitting system using a noise minimizing code, for selective calling of radio systems, using a selected multibit sequential binary word having a selected number of binary bits, such as 24, for example; and register means for storing said 24 bits; comprising
   (a) means for coding said word of 24 sequential binary bits into a coded transmission of clocked trains of binary signal pulses, where each binary signal pulse of said binary signal comprises a square pulse of selected magnitude, polarity and duration D, followed by a space of equal duration D; and wherein
   (b) for each bit of said 24 binary bits which is a logical one, first means to produce a train of a selected number M of said binary signal pulses; and for each bit of said 24 binary bits which is a logical zero, second means to produce a train of a selected number N of binary signal pulses; where N is substantially different from M;
   (c) between the end of a first train of said binary pulses and the beginning of the next train, means for providing a clocked time space of zero signal equal in length to the length of P binary signal pulses, where P is less than M or N; and
   (d) means to modulate a radio transmitter with said coded transmission.

2. The apparatus as in claim 1 in which said first train and said train together comprise a word, and including;
   (e) between the end of a first word and the beginning of the next word, means for providing a clocked time space of zero signal equal in length to the length of a selected number R of binary signal pulses, where R is greater than P.

3. The apparatus as in claim 1 in which said 24 binary bit word is derived from a multi-decimal-digit selected word; and including;
   (a) means for providing said multi-decimal-digit word; and
   (b) means for deriving from said multi-decimal-digit word said 24 binary bit word.

4. The apparatus as in claim 3 and including:
   (a) a calculator chip responsive to said multi-decimal-digit word to provide a 7-segment number corresponding to each decimal digit;
   (b) means for converting said 7-segment numbers to binary coded decimal configuration; and
   (c) means to store the output of said 7-segment conversion means in a 24 bit serial-in, parallel-out register.

5. A radio receiving system using a noise minimizing code for selective calling of radio stations, in which the coded transmission comprises a series of 24 binary bits, for example, converted to clocked digital signal pulses in which each digital signal pulse comprises a square positive half-cycle of selected time duration D and a following space of equal time duration D, comprising;
   (a) a 24-bit first register for storing the binary word corresponding to the selected radio receiving station;
   (b) means to receive the coded transmission calling said selected receiving station;
   (c) means to decode said coded transmission to form a 24-bit received binary word, and a second 24-bit register means to store said 24-bit received binary word;
   (d) means to compare said 24-bit words in said first and second registers; and
   (e) means responsive to said means to compare to enable a ringing signal when said comparison is positive and
   in which said means to decode said coded transmission of digital signal pulses, comprises;
   (f) first means to count the number of digital signal pulses in a train; and second means to determine the end of a train of digital pulses; and counter means responsive to said first and second means;
   (g) third means responsive to said counter means to determine if a sufficient number of digital signals have been received to comprise a valid signal;
   (h) fourth means responsive to said counter means to determine whether the number of digital signal pulses in a train correspond to a binary one bit or a binary zero bit; and
   (i) fifth means responsive to said third and fourth means to clock into said second 24 bit register said determined binary bit.

6. In a radio communication system for calling a selected radio receiver using a binary word indicative of the address of a selected receiver said binary word composed of a selected number B of sequential binary bits, which may be ones or zeros;

improved apparatus for coding said binary bits for noise immune transmission by radio, comprising:

(a) means for providing a series of clocked trains of digital pulses, wherein each digital pulse comprises a square pulse of logic level one and of time duration D, followed by a space of logical level zero and of time duration D;

(b) for each bit of said binary word which is a logical one, means to produce a train of a selected number M of digital pulses; and for each bit of said binary word which is a logical zero, means to produce a train of a selected number N of digital pulses, where N can be greater than, or less than M, in a ratio of the order of approximately 2 to 1;

(c) between the end of a first train of said digital pulses, and the beginning of the next train, means for providing an interbit space of zero signal level, comprising a clocked space equal to 2PD units of time, where P is a selected integer less than the smaller of M or N; and (d) means to modulate a radio transmitter in accordance with said series of trains of digital signal pulses.

7. The apparatus as in claim 6, and including after the end of said trains of digital signal pulses corresponding to said B sequential binary bits, means for providing a clocked train of digital signal pulses corresponding to a selected number of binary bits.

8. The apparatus as in claim 1 in which said first means comprises;

(a) clock means of selected frequency of pulses, and first gate means to transmit said clock pulses to said radio transmitter;

(b) first counter means for counting said clock pulses, said first counter means providing an output signal when M clock pulses have been counted;

(c) third means responsive to said register, and to said first counter means to control said first gate means to start said transmission of clock pulses, and to stop said transmission after M clock pulses have been transmitted;

(d) fourth means responsive to said register and to said first counter means to control said first gate means to start said transmission of clock pulses, and to stop said transmission after N clock pulses have been transmitted;

and (e) fifth means responsive to said first counter means and to said third and fourth means to control said first gate means to stop said transmission of clock pulses at the end of a train of M pulses or N pulses, for a period of P clock pulses.

9. The apparatus as in claim 1 in which M equals 6, N=12, and P=4.

* * * * *